(12) United States Patent
Devisme et al.

(10) Patent No.: US 10,138,313 B2
(45) Date of Patent: Nov. 27, 2018

(54) USE OF A FLUID POLYMERIC COMPOSITION FOR ENCAPSULATING PHOTOVOLTAIC MODULES

(71) Applicant: ARKEMA FRANCE, Colombes (FR)

(72) Inventors: Samuel Devisme, Rouen (FR); Catherine Corfias-Zuccalli, Villeurbanne (FR); Sophie Caminade, Paris (FR); Christian Laurichesse, Lons (FR)

(73) Assignee: ARKEMA FRANCE, Colombes (FR)

( * ) Notice: Subject to any disclaimer, the term of this patent is extended or adjusted under 35 U.S.C. 154(b) by 0 days.

(21) Appl. No.: 14/764,674

(22) PCT Filed: Feb. 4, 2014

(86) PCT No.: PCT/FR2014/050207
§ 371 (c)(1),
(2) Date: Jul. 30, 2015

(87) PCT Pub. No.: WO2014/122392
PCT Pub. Date: Aug. 14, 2014

(65) Prior Publication Data
US 2015/0361204 A1    Dec. 17, 2015

(30) Foreign Application Priority Data

Feb. 6, 2013   (FR) .................................... 13 51014

(51) Int. Cl.
*H01L 31/048*   (2014.01)
*C08F 222/10*   (2006.01)

(52) U.S. Cl.
CPC ........ *C08F 222/10* (2013.01); *H01L 31/0481* (2013.01); *Y02E 10/50* (2013.01)

(58) Field of Classification Search
None
See application file for complete search history.

(56) References Cited

U.S. PATENT DOCUMENTS 5,401,803 A * 3/1995 Rex .................. C08L 63/10
                                                  525/170
2006/0207646 A1    9/2006 Terreau et al.
(Continued)

FOREIGN PATENT DOCUMENTS

JP    64-019780 A    1/1989
JP    3163807 B2    5/2001
(Continued)

OTHER PUBLICATIONS

International Search Report (PCT/ISA/210) dated Apr. 24, 2014, by the European Patent Office as the International Searching Authority for International Application No. PCT/FR2014/050207.
(Continued)

*Primary Examiner* — Alexander Ghyka
(74) *Attorney, Agent, or Firm* — Buchanan Ingersoll & Rooney P.C.

(57) ABSTRACT

The use of a polymeric composition as an encapsulant in a photovoltaic module, said polymeric composition including a copolymer that comprises an ethylene monomer and a carboxylic acid vinyl ester comonomer, in particular an ethylene vinyl acetate copolymer, and the polymeric composition having a Brookfield viscosity measured at 120° C. of between 10,000 mPa·s and 25,000 mPa·s. Further, a method for encapsulating a photovoltaic module using this polymeric composition.

16 Claims, 1 Drawing Sheet

(56) References Cited

U.S. PATENT DOCUMENTS

2011/0048501 A1* 3/2011 Jaus ................ H01L 31/02008
 136/246
2012/0186631 A1 7/2012 Terreau et al.

FOREIGN PATENT DOCUMENTS

WO    WO 2005/006451 A1    1/2005
WO    WO 2010/067040 A1    6/2010

OTHER PUBLICATIONS

Handbook of Photovoltaic Science and Engineering, edited by Antonio Luque et al., Wiley, 2003, the whole book.

* cited by examiner

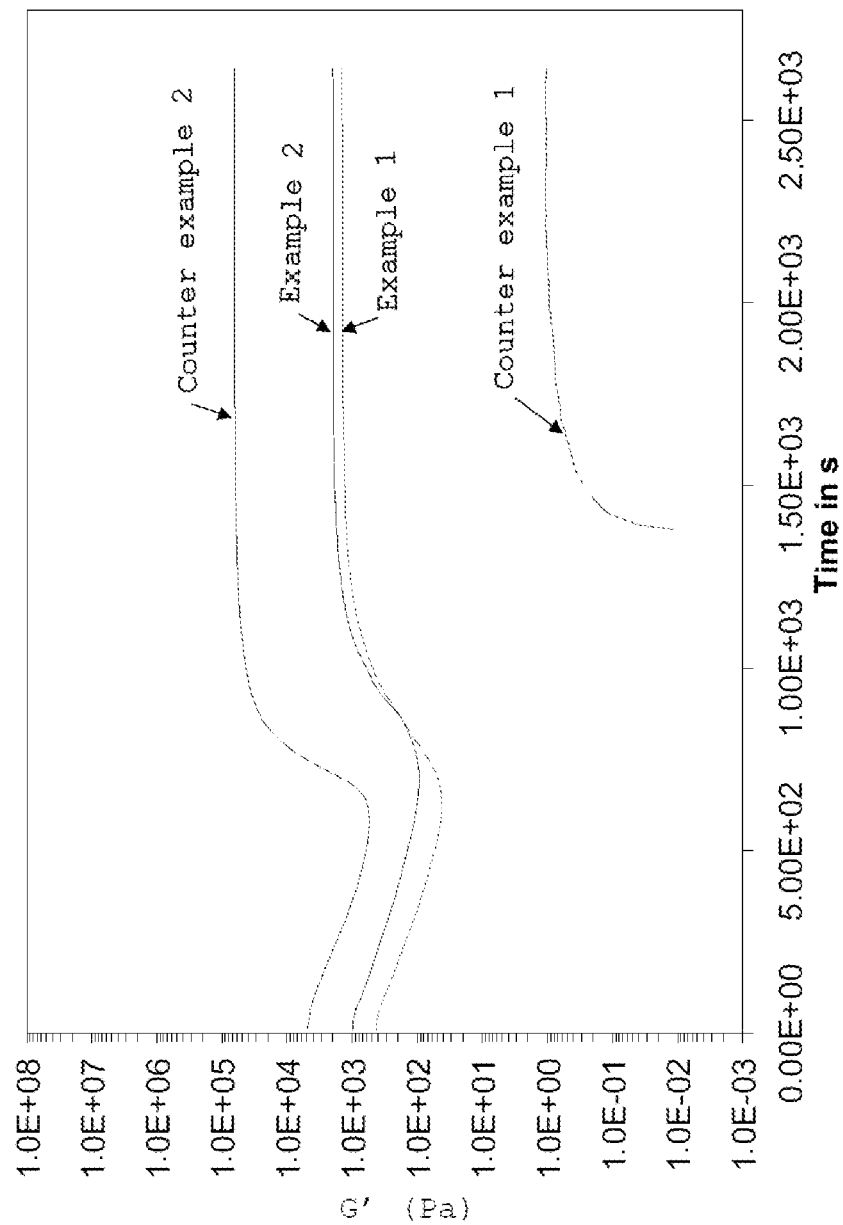

USE OF A FLUID POLYMERIC COMPOSITION FOR ENCAPSULATING PHOTOVOLTAIC MODULES

TECHNICAL FIELD OF THE INVENTION

The invention falls within the field of the fabrication of photovoltaic modules. More particularly, it relates to the use of a fluid polymeric composition for encapsulating photovoltaic modules.

PRIOR ART

Photovoltaics is an energy-producing technology in full expansion, which has the advantage of not emitting greenhouse gases unlike fossil fuels, and of which the fuel, which is light, is inexhaustible. In addition to being ecological, photovoltaics is practical since a photovoltaic module makes it possible to supply with electricity an isolated dwelling or devices which cannot be connected to the electrical circuit, such as cell phones, ticket machines, bus shelters, etc.

A photovoltaic module, or solar panel, is an electrical generator which makes it possible to convert solar energy into a direct current. It generally consists of an assembly of photovoltaic cells based on a semiconductor material such as silicon, which are connected to one another electrically in series and/or in parallel.

It is known practice to encapsulate this assembly of photovoltaic cells in a material usually denoted by the term "encapsulant". The encapsulant generally comprises an upper part and a lower part, the photovoltaic cells being blocked between these two parts. To complete the photovoltaic module, a protective front sheet and a protective backsheet are placed against each face of the encapsulant. The role of the encapsulant consists in keeping the cells linked, in electrically insulating them and in protecting them against the exterior environment, in particular water and air.

The encapsulant is generally based on ethylene/vinyl acetate (EVA) copolymer as has been described in patent application JP 19870174967, which constitutes the technical solution that is currently the most widely used. The polymeric composition used as encapsulant is in the form of a film with a thickness of typically between 50 µm and 20 mm. The film may be a monolayer or multilayer.

In a conventional process for fabricating a photovoltaic module, several steps are required for the encapsulation of the cells.

In a very first step, the polymeric composition used as encapsulant is prepared by copolymerization, typically by radical copolymerization.

This polymeric composition is then mixed with additives using known techniques for mixing thermoplastic materials, such as extrusion or blending. The conventional additives added to the polymeric composition are thermally activated peroxides for crosslinking the polymeric composition, silanes for improving the adhesive properties and anti-UV agents for improving the UV resistance.

The mixture obtained is then formed in the form of a film using known techniques such as pressing, blown film extrusion, extrusion-lamination, extrusion-coating, cast film extrusion and calendering.

The photovoltaic cells are then encapsulated in the polymer film. Typically, the following are successively put together: a protective backsheet, a first layer of encapsulating polymer film, the photovoltaic cells, a second layer of encapsulating polymer film and then, finally, a protective front sheet. The layers are assembled by pressing techniques combined with heat treatment, such as hot pressing, vacuum pressing and hot lamination. When the temperature reaches the melting point of the polymeric composition, the latter flows all around the assembly of photovoltaic cells. Then, when the temperature reaches the activation temperature of the crosslinking agent (typically around 150° C.), the polymeric composition crosslinks, thereby making it possible to obtain a very strongly and irreversibly bonded, compact assembly.

The fabrication of photovoltaic modules using films of polymeric composition is, for example, described in International patent application WO 2010/067040. Other elements regarding the fabrication of photovoltaic modules can be found, for example, in the publication "Handbook of Photovoltaic Science and Engineering", Wiley, 2003.

This process for fabricating photovoltaic modules, which currently constitutes the most widely used fabrication process, makes it possible to obtain photovoltaic modules with satisfactory properties: good adhesion of the various layers, little delamination of the various layers, resistance to abrasion and to impacts, impermeability to water and to atmospheric oxygen, etc. However, this process has the major drawback of requiring at least four successive steps (copolymerization, mixing with additives, forming in the form of a film and pressing with heat treatment). Each of these steps requires a specific material. The complete preparation process is therefore lengthy and expensive. In addition, the final pressing step with heat treatment is a treatment step which can only be carried out in batches (batch process). Those skilled in the art do not at the moment have available a method which enables the continuous fabrication of photovoltaic modules.

There is therefore currently a need to provide a process for the fabrication of photovoltaic modules which is shorter, which comprises fewer steps, which is faster to carry out and which is less expensive. Furthermore, there is also the need to provide a continuous process for the fabrication of photovoltaic modules.

SUMMARY OF THE INVENTION

A subject of the invention is the use, as encapsulant in a photovoltaic module, of a polymeric composition, said polymeric composition comprising a copolymer which comprises an ethylene monomer and a carboxylic acid vinyl ester comonomer, the carboxylic acid vinyl ester comonomer representing between 5% and 50% by weight, relative to the total weight of the copolymer, and the polymeric composition having a Brookfield viscosity, measured at 120° C., of between 10 000 mPa·s and 25 000 mPa·s.

BRIEF DESCRIPTION OF THE DRAWINGS

FIG. 1 shows curves obtained for various formulations of examples of embodiment of the present invention and counter examples.

DETAILED DESCRIPTION

It is specified that, throughout this description, the expression "between" should be understood to include the limits mentioned.

The polymeric composition used according to the invention comprises a copolymer. Said copolymer comprises at least one ethylene monomer and at least one carboxylic acid vinyl ester comonomer. The copolymer may optionally comprise other comonomer(s).

Preferably, the carboxylic acid vinyl ester comonomer can be chosen from the group consisting of vinyl acetate, vinyl 2-ethylhexanoate (V2EH), vinyl octanoate and versatic acid vinyl ester. Among these comonomers, vinyl acetate is preferred. The copolymer is therefore, in this case, an ethylene/vinyl acetate copolymer.

The copolymer comprises from 5% to 50%, preferentially from 10% to 40%, more preferentially from 15% to 35% by weight of carboxylic acid vinyl ester comonomer, relative to the total weight of the copolymer.

Moreover, the copolymer may comprise from 50% to 95%, preferentially from 60% to 90%, more preferentially from 65% to 85% by weight of ethylene monomer, relative to the total weight of the copolymer.

The amounts of the various comonomers present in the copolymer can be measured by infrared spectroscopy using ISO standard 8985 (1998).

Preferentially, the copolymer consists of an ethylene monomer and of a carboxylic acid vinyl ester comonomer. However, it is also possible for the copolymer to comprise one or more other comonomers which can be chosen from alkyl and hydroxyalkyl acrylates and methacrylates, such as methyl acrylate, methyl methacrylate, ethyl acrylate, ethyl methacrylate, butyl acrylate, butyl methacrylate, hydroxyethyl acrylate, hydroxyethyl methacrylate, 2-ethylhexyl acrylate, 2-ethylhexyl methacrylate, propyl acrylate, propyl methacrylate, isopropyl acrylate, isopropyl methacrylate, n-butyl acrylate, n-butyl methacrylate, isobutyl acrylate, isobutyl methacrylate, tert-butyl acrylate, tert-butyl methacrylate, n-pentyl acrylate, n-pentyl methacrylate, neopentyl acrylate, neopentyl methacrylate, hexyl acrylate, hexyl methacrylate, heptyl acrylate, heptyl methacrylate, octyl acrylate, octyl methacrylate, neooctyl acrylate, neooctyl methacrylate, nonyl acrylate, nonyl methacrylate, neononyl acrylate, neononyl methacrylate, decyl acrylate, decyl methacrylate, neodecyl acrylate, neodecyl methacrylate, lauryl acrylate, lauryl methacrylate, palmityl acrylate, palmityl methacrylate, stearyl acrylate or stearyl methacrylate. The total weight of one or more other comonomers, relative to the total weight of the copolymer, may be between 0% and 20%, preferentially between 5% and 15%, more preferentially between 5% and 10%.

The copolymer according to the invention can be obtained by polymerization according to the process indicated hereinafter:

The copolymer can be prepared by means of a high-pressure radical polymerization process. The polymerization can be carried out, for example, in a stirred or tubular autoclave reactor. The pressure inside the reactor may be between 1000 bar and 3000 bar, preferentially between 1500 bar and 2500 bar. The temperature during the initiation of the reaction may be between 100° C. and 300° C., advantageously between 100° C. and 170° C. The maximum reaction temperature may be between 180° C. and 300° C. and preferably between 200° C. and 280° C.

The copolymerization can be carried out by introducing the ethylene monomer, the carboxylic acid vinyl ester comonomer and an initiator for polymerization at high pressure into an autoclave or tubular reactor at an initial temperature. When a tubular reactor is used, the introduction of the mixture of the ethylene monomer, the carboxylic acid vinyl ester comonomer and the polymerization initiator is preferably carried out at the inlet of the tubular reactor, and optionally at at least one other injection point located along the tubular reactor. The term "multipoint injection technique" is then used.

The amounts of the comonomers introduced are adjusted according to the desired final content in the copolymer.

The amount of initiator can range between 10 ppm and 1000 ppm by weight, preferentially between 10 ppm and 800 ppm, more preferentially between 10 ppm and 500 ppm, relative to the monomers introduced.

All the organic and inorganic compounds which release free radicals under the reaction conditions can be used as polymerization initiator. Preferably, a compound or mixtures of compounds comprising at least one peroxide group can be used. The polymerization initiator can preferentially be chosen from the group consisting of peroxy esters, diacyls, percarbonates, peroxy ketals, dialkyls, hydroperoxides, and mixtures thereof. Advantageously, the polymerization initiator can be chosen from the group consisting of tert-butyl peroxy esters, the ester group of which contains from 5 to 10 carbon atoms, such as tert-butyl peroxyneodecanoate, tert-butyl peroxy-2-ethyl hexanoate, tert-butyl peroxy-3,5,5-trimethylhexanoate and tert-butyl peroxypivalate, or it may be di-tert-butyl peroxide. These peroxides are particularly suitable for the copolymerization reaction described herein.

In addition to the monomers and to the initiator, use may advantageously be made of a transfer agent in proportions, relative to the total amount of monomers by weight, of between 0% and 4%, preferentially of between 0.1% and 3%, more preferentially of between 0.3% and 0.6%. These transfer agents make it possible to control the molecular weights of the copolymer formed. The transfer agent can be chosen from aliphatic ketones or aldehydes. It is preferably chosen from propanaldehyde and MEK (methyl ethyl ketone).

Generally, the amounts of initiator and of transfer agent are adjusted so as to obtain a copolymer having the desired Brookfield viscosity of from 10 000 to 25 000 mPa·s at 120° C., which can correspond to a number-average molecular weight (Mn) of between 6000 and 12 000 and to a weight-average molecular weight (Mw) of between 20 000 g/mol and 60 000 g/mol.

At the end of the copolymerization, a residual amount of less than 700 ppm of the transfer agent may be contained in the final copolymer. The initiator is, for its part, totally decomposed.

The polymeric composition used according to the invention comprises the copolymer as described above. The copolymer may represent between 92% and 99.9%, preferentially between 97.5% and 99.5%, relative to the total weight of the polymeric composition. In addition, the polymeric composition may comprise other compounds, which are generally denoted by the term "additives". These additives may represent, in total, between 0.1% and 10%, preferentially between 0.5% and 3.5%, relative to the total weight of the polymeric composition.

The additive(s) which may be included in the polymeric composition can be chosen from those known to those skilled in the art as additives present in the polymeric compositions in the form of a film serving as encapsulant.

Quite particularly, the polymeric composition according to the invention may comprise a crosslinking agent. The function of the crosslinking agent is to crosslink the copolymer present in the polymeric composition after deposition thereof on the photovoltaic cells. The crosslinking makes it possible to improve the thermomechanical properties of the encapsulant, in particular at high temperature. The crosslinking agent can be chosen from thermally activated crosslinking agents, irradiation-activated crosslinking agents, or the like. Preferably, the crosslinking agent is a thermally activated crosslinking agent, preferentially a peroxide.

Advantageously, the crosslinking agent is chosen from the group consisting of O,O-tert-butyl O-(2-ethylhexyl)monoperoxycarbonate, O-(2-ethylhexyl) O,O-tert-pentyl peroxycarbonate, tert-butyl hydroperoxide, 2,5-dimethyl-2,5-di(tert-butylperoxy)hexane, tert-butyl 2-ethylperoxyhexanoate and 1-1-di(tert-butylperoxy)-3,3,5-trimethylcyclohexane.

The crosslinking agent can represent, in total, between 0.1% and 5%, preferentially between 0.5% and 2.5%, more preferentially between 0.7% and 2% by weight, relative to the total weight of the polymeric composition.

Moreover, the polymeric composition according to the invention may comprise a co-crosslinking agent. The co-crosslinking agents advantageously make it possible to accelerate the rate of crosslinking and/or to optimize the degree of crosslinking achieved. The co-crosslinking agent can in particular be chosen from multifunctional monomers bearing at least 2 vinyl functions. Mention may be made, for example, of triallyl isocyanurate or triallyl cyanate.

In addition, the polymeric composition according to the invention may comprise a coupling agent. The coupling agents advantageously make it possible to improve the adhesion between the polymeric composition and the other elements of the photovoltaic module. The coupling agent may in particular be chosen from organic titanates or silanes. Advantageously, the coupling agent is chosen from the group consisting of silanes, for example 3-trimethoxysilylpropyl methacrylate or vinyltrimethoxysilane.

Furthermore, the polymeric composition according to the invention may comprise a UV-absorbing agent. These agents are known to extend the lifetime of the photovoltaic module by preventing the damage to the various components caused by UV radiation. The UV-absorbing agent may in particular be chosen from benzotriazoles or benzophenones.

The polymeric composition according to the invention may also comprise a hindered amine light stabilizer (HALS) and/or an antioxidant. The role of these additives is also to extend the lifetime of the photovoltaic module. By virtue of their antioxidant properties, they protect the various constituents of the module against the damaging effects of the radicals which can be created by exposure to UV radiation or to heat. The HALS may in particular be chosen from bis(2,2,6,6-tetramethyl-4-piperidyl) sebacate, poly[[6-[(1,1,3,3-tetramethylbutyl)amino]-1,3,5-triazine-2,4-diyl][(2,2,6,6-tetramethyl-4-piperidinyl)imino]-1,6-hexanediyl[(2,2,6,6-tetramethyl-4-piperidinyl)imino]] or else bis(1,2,2,6,6-pentamethyl-4-piperidyl) [[3,5-bis(1,1-dimethylethyl)-4-hydroxyphenyl]methyl]butylmalonate. The antioxidant may in particular be chosen from pentaerythrityl tetrakis-3-(3,5-di-tert-butyl-4-hydroxy-phenyl)propionate, octadecyl 3-(3,5-di-tert-butyl-4-hydroxyphenyl)propionate or tris(2,4-di-tert-butylphenyl)phosphite.

The addition of these various additives can be carried out by methods known to those skilled in the art, such as the use of a melting pot or of an internal mixer or by impregnation in the case of additives in liquid form.

The polymeric composition which is used according to the invention has a Brookfield viscosity, measured at 120° C., of between 10 000 mPa·s and 25 000 mPa·s, and preferentially between 12 000 mPa·s and 23 000 mPa·s.

The viscosity measurements were carried out on a Brookfield viscometer. The reference temperature is taken at 120° C. The measurements can in particular be carried out according to the following procedure:

The equipment used is a Brookfield RV-DVIII rheometer. A spindle of cylindrical geometry with conical ends (type SC4-27 or SC4-29 depending on the viscosity range studied) is immersed in the sample, the temperature of which is regulated at 120° C. The spindle is rotated at a speed of 20 revolutions per minute. The resistance applied by the sample against the rotation of the spindle is measured and makes it possible to calculate the viscosity of said sample.

By virtue of its particular physicochemical properties, the polymeric composition according to the invention can be used as an encapsulant in a photovoltaic module in an entirely novel manner.

Indeed, by virtue of its relatively low viscosity, the polymeric composition can be cast and can be applied directly to the assembly of photovoltaic cells. It is therefore no longer necessary to form the polymeric composition serving as encapsulant in the form of a film before using it.

The present invention therefore also relates to a process for the fabrication of a photovoltaic module, wherein one or more photovoltaic cells are encapsulated with the polymeric composition described above. A subject of the invention is also a particular process for encapsulating a photovoltaic module, comprising the steps consisting in:

a) obtaining a polymeric composition comprising:
   a copolymer comprising an ethylene monomer and a carboxylic acid vinyl ester comonomer, the carboxylic acid vinyl ester comonomer representing between 5% and 50% by weight, relative to the total weight of the copolymer, and
   a crosslinking agent,
the polymeric composition having a Brookfield viscosity, measured at 120° C., of between 10 000 mPa·s and 25 000 mPa·s;

b) forming a stack comprising, in order, a protective backsheet, a first layer of the polymeric composition, an assembly of photovoltaic cells, a second layer of the polymeric composition, and a protective front sheet; then c) applying an activation treatment suitable for the crosslinking agent in order to crosslink the composition.

The step consisting in obtaining the polymeric composition may comprise the steps consisting in synthesizing the suitable copolymer or in procuring it directly in final form, then in mixing it with a crosslinking agent and optionally with other additives. These various steps, and also the compositions used, may be as described above in the present text. Alternatively, it is also possible to procure the polymeric composition comprising the copolymer and the thermally activated crosslinking agent in already mixed form.

During the stack formation step, the layers of the polymeric composition according to the invention can be deposited by any means known to those skilled in the art without prior forming. The relatively low viscosity of the polymeric composition in the molten state makes it possible to use techniques known in particular in the paint field, for example by means of a roll, or in the hot-melt field, for example by coating with a bar-coater.

Once the stack has been formed, an activation treatment suitable for the activation agent is carried out, so as to crosslink the polymeric composition. For example, in the case of a thermally activated crosslinking agent, this step may consist in thermally treating the stack at a temperature above the activation temperature of the agent for crosslinking the polymeric composition.

Polymeric compositions comprising an ethylene/vinyl acetate copolymer and having a Brookfield viscosity sufficiently low to be flowable are already currently known under the name Evazole® sold by the company Arkema. These compositions are conventionally used as an additive in fuels.

However, the inventors have discovered that, the lower the viscosity of the polymeric composition, the more difficult it becomes to satisfactorily crosslink the copolymer, until a critical viscosity is reached below which the polymeric composition is no longer crosslinkable. Thus, the Evazole® product range is not applicable for a photovoltaic encapsulant application.

It is therefore entirely surprising that the polymeric composition described in the present invention has both a viscosity such that the composition can be directly applied as a paint, and good crosslinkability.

The photovoltaic modules obtained by means of the process as described above have properties which are at least as satisfactory as the modules obtained by means of a conventional encapsulation process using an encapsulant film. In particular, it has been noted that the various layers of the modules obtained according to the process of the present invention have good adhesion between them and that the modules show no delamination problems.

The process which is the subject of the present invention can be advantageously be carried out continuously. Indeed, the stack formation and heat treatment steps can be carried out continuously according to conventional methods.

Other objectives, characteristics and advantages of the invention will emerge from the following exemplary embodiments, which are given purely by way of illustration and are in no way limiting, and which refer to the appended FIG. 1 which is a graph representing the curves of change in elastic modulus G' (in Pa) of the exemplified compositions as a function of time t (in s).

EXAMPLES

1) Synthesis of the Copolymer/Characterization of the Brookfield Viscosity

In examples 1 and 2, two copolymers were synthesized from the following reagents:

| Test | Vinyl acetate (% by weight) | Transfer agent injected (% by weight) | Peroxide content (ppm by weight) |
|---|---|---|---|
| Example 1 | 28 | 0.5 | 162 |
| Example 2 | 28 | 0.4 | 186 |

Another copolymer was prepared under conditions making it possible to obtain a Brookfield viscosity of less than 10 000 mPa·s. This is counter example 1.

| Test | Vinyl acetate (% by weight) | Transfer agent injected (% by weight) | Peroxide content (ppm by weight) |
|---|---|---|---|
| Counter example 1 | 28 | 2 | 244 |

Finally, counter example 2 is a commercial grade Evatane® 28800 supplied by the company Arkema, the Brookfield viscosity of which is greater than 25 000 mPa·s. The vinyl acetate comonomer content is 28% by weight.

These copolymers were characterized on a Brookfield rheometer under the conditions described in the table below:

| Brookfield viscosity characterization conditions | |
|---|---|
| Equipment | Brookfield RV-DVIII rheometer |
| Spindle used | SC4-27 or SC4-29 |

| Brookfield viscosity characterization conditions | |
|---|---|
| Characterization temperature | 120° C. |
| Spindle rotation speed | 20 revolutions/minute |

The Brookfield viscosities thus measured are given in the table below:

| Test | Spindle used | Brookfield viscosity at 120° C. (mPa · s) |
|---|---|---|
| Example 1 | SC4-29 | 13 450 |
| Example 2 | SC4-29 | 22 400 |
| Counter example 1 | SC4-27 | 525 |
| Counter example 2 | SC4-29 | 76 000 |

2) Preparation of the Formulation/Additivation

The additivation of the copolymers with 3-trimethoxysilylpropyl methacrylate (coupling agent) and with O,O-tert-butyl O-(2-ethylhexyl)monoperoxycarbonate (crosslinking agent) was carried out by hot-mixing in a melting pot regulated at 80° C. and stirred at a speed of 250 rpm.

The additive contents are as described in the table below:

| Product | Content in the formulation (% by weight) |
|---|---|
| Ethylene/vinyl acetate copolymer | 98.2 |
| O,O-tert-butyl O-(2-ethylhexyl)monoperoxycarbonate | 1.5 |
| 3-Trimethoxysilylpropyl methacrylate | 0.3 |
| Total | 100 |

3) Evaluation of Crosslinkability

The formulations obtained were then analyzed by parallel-plate dynamic rheometry. The protocol followed is as described in the table below:

| Protocol for evaluating crosslinkability by parallel-plate rheometry | |
|---|---|
| Rheometry | Anton Paar - Model MCR 301 |
| Plate diameter | 50 mm |
| Gap | 1 mm |
| Deformation amplitude | 10% |
| Oscillation frequency | 10 Hz |
| Procedure time/temperature | 80° C.          Initial<br>Ramp 80 → 150° C.     14 minutes<br>Isotherm 150° C.      30 minutes |
| Data obtained | Curve of change in elastic modulus G' (Pa) as a function of time t (s) |
| Criterion representative of the level of crosslinking | Level of elastic modulus G' after crosslinking greater than or equal to $10^3$ Pa at 150° C. |

The curves obtained for the various formulations are given in FIG. 1.

On the basis of these curves, the levels of elastic modulus G' at 150° C. after crosslinking were obtained. They are given in the table below:

| Test | Level of elastic modulus G' at 150° C. after crosslinking (Pa) |
|---|---|
| Example 1 | 1450 |
| Example 2 | 2000 |
| Counter example 1 | 1.05 |
| Counter example 2 | 65 800 |

4) Use of the Encapsulant

The formulations were used by coating by means of a bar-coater. The formulations were heated to a temperature of 100° C. and then cast on a glass substrate. The bar-coater then made it possible to spread each formulation into a layer of even thickness.

In the case of examples 1 and 2, and also of counter example 1, the coating did not pose a problem and an even layer could be obtained. However, given the excessively low viscosity of counter example 1, the latter exhibits no mechanical strength after cooling, even after the crosslinking step. Examples 1 and 2, for their part, exhibited good applicability, combined with good mechanical strength after cooling. Finally, counter example 2, given its relatively high viscosity, did not allow application by means of this coating process.

The invention claimed is:

1. A polymeric composition configured for use as an encapsulant in a photovoltaic module, said polymeric composition comprising a copolymer which comprises an ethylene monomer and a carboxylic acid vinyl ester comonomer, the carboxylic acid vinyl ester comonomer representing between 5% and 50% by weight, relative to the total weight of the copolymer, and the polymeric composition having a Brookfield viscosity, measured at 120° C., of between 10,000 mPa·s and 25,000 mPa·s,
   wherein the copolymer represents between 92% and 99.9%, relative to the total weight of the polymeric composition.

2. The polymeric composition of claim 1, wherein the carboxylic acid vinyl ester comonomer is chosen from the group consisting of vinyl acetate, vinyl 2-ethylhexanoate, vinyl octanoate and versatic acid vinyl ester.

3. The polymeric composition of claim 1, wherein the copolymer comprises from 10% to 40% by weight of carboxylic acid vinyl ester comonomer, relative to the total weight of the copolymer.

4. The polymeric composition of claim 1, wherein the copolymer consists of an ethylene monomer and of a carboxylic acid vinyl ester comonomer.

5. The polymeric composition of claim 1, wherein the polymeric composition further comprises a crosslinking agent, the crosslinking agent representing in total between 0.1% and 5%, relative to the total weight of the polymeric composition.

6. The polymeric composition of claim 1, wherein the polymeric composition has a Brookfield viscosity, measured at 120° C., of between 12,000 mPa·s and 23,000 mPa·s.

7. A process for encapsulating a photovoltaic module, comprising:
   a) obtaining a polymeric composition according to claim 1, and a crosslinking agent;
   b) forming a stack comprising, in order, a protective backsheet, a first layer of the polymeric composition, an assembly of photovoltaic cells, a second layer of the polymeric composition, and a protective front sheet; then
   c) applying an activation treatment suitable for the crosslinking agent in order to crosslink the composition.

8. The process as claimed in claim 7, wherein the crosslinking agent is a thermally activated crosslinking agent and step c) consists of heat treating the stack at a temperature above the activation temperature of the agent for crosslinking the polymeric composition.

9. The process as claimed in claim 7, wherein the process is carried out continuously.

10. The polymeric composition of claim 1, wherein the carboxylic acid vinyl ester comonomer is vinyl acetate.

11. The polymeric composition of claim 1, wherein the copolymer comprises from 15% to 35% by weight of carboxylic acid vinyl ester comonomer, relative to the total weight of the copolymer.

12. The polymeric composition of claim 1, wherein the copolymer represents between 97.5% and 99.5%, relative to the total weight of the polymeric composition.

13. The polymeric composition of claim 1, wherein the polymeric composition further comprises a crosslinking agent, the crosslinking agent representing in total between 0.5% and 2.5%, relative to the total weight of the polymeric composition.

14. The polymeric composition of claim 1, wherein the polymeric composition further comprises a crosslinking agent, the crosslinking agent representing in total between 0.7% and 2% by weight, relative to the total weight of the polymeric composition.

15. The polymeric composition of claim 1, wherein the polymeric composition further comprises a coupling agent.

16. The polymeric composition of claim 15, wherein the coupling agent is an organic titanate or an organic silane.

* * * * *